(12) United States Patent
Katsuhara et al.

(10) Patent No.: US 8,766,266 B2
(45) Date of Patent: Jul. 1, 2014

(54) ELECTRONIC DEVICE AND SEMICONDUCTOR SUBSTRATE

(75) Inventors: Mao Katsuhara, Kanagawa (JP); Akira Yumoto, Kanagawa (JP)

(73) Assignee: Sony Corporation (JP)

( * ) Notice: Subject to any disclaimer, the term of this patent is extended or adjusted under 35 U.S.C. 154(b) by 128 days.

(21) Appl. No.: 13/587,293

(22) Filed: Aug. 16, 2012

(65) Prior Publication Data

US 2013/0048993 A1    Feb. 28, 2013

(30) Foreign Application Priority Data

Aug. 25, 2011    (JP) .................................. 2011-183985

(51) Int. Cl.
  *H01L 29/04*    (2006.01)

(52) U.S. Cl.
  USPC ............................... 257/59; 313/504; 438/99

(58) Field of Classification Search
  USPC ...................... 257/40, E51.006, 57, E29.273, 257/E33.053; 438/99, 158, 104, 34, 591, 438/144, 149, 151, 197; 313/502–506
  See application file for complete search history.

(56) References Cited

FOREIGN PATENT DOCUMENTS

JP    2002-108250    4/2002
JP    2006-114862    4/2006

*Primary Examiner* — Julio J Maldonado
*Assistant Examiner* — Robert Bachner
(74) *Attorney, Agent, or Firm* — Sheridan Ross P.C.

(57) ABSTRACT

A semiconductor substrate includes: a thin-film transistor including an organic semiconductor layer; and a light absorption-transmission layer provided in a pathway that leads external light to the organic semiconductor layer. The light absorption-transmission layer absorbs light of a wavelength range that includes at least a part of a light absorption wavelength range of the organic semiconductor layer, and allows light of a remaining wavelength range to pass therethrough.

12 Claims, 2 Drawing Sheets

ELECTRONIC DEVICE AND SEMICONDUCTOR SUBSTRATE

BACKGROUND

The present technology relates to a semiconductor substrate provided with a thin-film transistor that includes an organic semiconductor layer, and to an electronic device using the same.

In recent years, various electronic devices use a thin-film transistor (TFT) as a switching element or others, and the TFT is mounted to the electronic devices as a part of a semiconductor substrate. As the TFT, an organic TFT using an organic semiconductor material for forming a semiconductor layer (channel layer) has been recently considered as a promising alternative to an inorganic TFT using an inorganic semiconductor material therefor. This is because, with the organic TFT, the semiconductor layer is able to be formed by coating so that the cost reduction is achieved. Also with the organic TFT, the semiconductor layer is able to be formed at a temperature lower than that for vapor deposition or others, thereby allowing the use of a low-heat-resistant flexible plastic film or others as a support base.

Among the electronic devices including the organic TFT, some such as a display device use a light source. Such a display device is typified by an organic electroluminescence (EL) display device including a light-emitting layer, a liquid crystal display device provided with a backlight, or others.

The concern here is that when light from the light source reaches the organic semiconductor layer of the organic TFT, the organic semiconductor layer may unexpectedly absorb the light of some wavelength range. This causes unpredictable doping in the organic semiconductor layer, and as a result, electrical characteristics such as threshold voltage easily deteriorate in the organic TFT.

For reducing the influence of light from the light source, several related technologies have been proposed so far. To be specific, in an organic EL display device using an inorganic TFT, in order to prevent deterioration in the electrical characteristics of an inorganic semiconductor layer made of amorphous silicon or others, a light-shielding layer in the color of black is provided between a light-emitting layer and the inorganic TFT (for example, see Japanese Unexamined Patent Application Publication No. 2002-108250). Moreover, in a liquid crystal display device using an organic TFT, in order to prevent the deterioration in the electrical characteristics of an organic semiconductor layer made of pentacene or others, a light-shielding film in use is a gate electrode provided between a backlight and the organic semiconductor layer (for example, see Japanese Unexamined Patent Application Publication No. 2006-114862).

SUMMARY

In order to accelerate the use of an electronic device that uses an organic TFT, expected are measures against deterioration in electronic characteristics of an organic semiconductor layer. However, such measures are not yet sufficiently taken.

It is thus desirable to provide a semiconductor substrate and an electronic device capable of ensuring electrical characteristics of an organic semiconductor layer.

An electronic device according to an embodiment of the present technology includes: a light source; a thin-film transistor including an organic semiconductor layer; and a light absorption-transmission layer provided in a pathway that leads light generated from the light source to the organic semiconductor layer. The light absorption-transmission layer absorbs light of a wavelength range that includes at least a part of a light absorption wavelength range of the organic semiconductor layer, and allows light of a remaining wavelength range to pass therethrough.

An electronic device according to another embodiment of the present technology includes: a light source; a thin-film transistor including an organic semiconductor layer; and a light absorption-transmission layer provided in a pathway that leads light generated from the light source to the organic semiconductor layer. The light absorption-transmission layer includes an organic semiconductor skeleton substantially same as an organic semiconductor skeleton of the organic semiconductor layer.

A semiconductor substrate according to an embodiment of the present technology includes: a thin-film transistor including an organic semiconductor layer; and a light absorption-transmission layer provided in a pathway that leads external light to the organic semiconductor layer. The light absorption-transmission layer absorbs light of a wavelength range that includes at least a part of a light absorption wavelength range of the organic semiconductor layer, and allows light of a remaining wavelength range to pass therethrough.

According to the semiconductor substrate and the electronic device of the above-described respective embodiments of the present technology, the light absorption-transmission layer is provided in the pathway that leads the light to the organic semiconductor layer. The light absorption-transmission layer absorbs the light of the wavelength range that includes at least a part of the light absorption wavelength range of the organic semiconductor layer and allows light of the remaining wavelength range to pass therethrough, or includes the organic semiconductor skeleton substantially the same as the organic semiconductor skeleton of the organic semiconductor layer. Hence, it is possible to ensure the electrical characteristics of the organic semiconductor layer.

It is to be understood that both the foregoing general description and the following detailed description are exemplary, and are intended to provide further explanation of the technology as claimed.

BRIEF DESCRIPTION OF THE DRAWINGS

The accompanying drawings are included to provide a further understanding of the disclosure, and are incorporated in and constitute a part of this specification. The drawings illustrate embodiments and, together with the specification, serve to explain the principles of the technology.

DETAILED DESCRIPTION

In the below, embodiments of the present technology are described in detail by referring to the accompanying drawings. The description is given in the following order.

1. Electronic Device in First Embodiment (Organic EL Display Device)
2. Electronic Device in Second Embodiment (Liquid Crystal Display Device)

1. Electronic Device in First Embodiment

Organic EL Display Device

[Configuration of Organic EL Display Device]

First of all, described is an electronic device according to a first embodiment of the present technology. The electronic device herein is an organic EL display device being an exemplary display device, and includes organic TFTs as switching elements. Note that a semiconductor substrate according to one embodiment of the present technology is described below together with the electronic device, because the semiconductor substrate is applied to the electronic device described herein.

Figure 1:
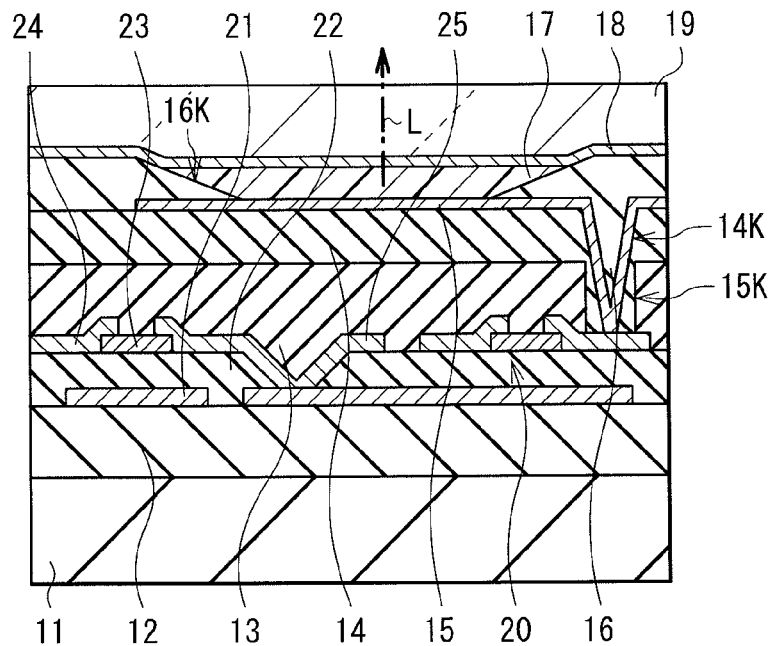
FIG. 1 is a cross-sectional diagram showing the configuration of an electronic device (organic EL display device) according to a first embodiment of the present technology.

FIG. 1 shows the cross-sectional configuration of an organic EL display device. This organic EL display device includes, on a support base 11, a planarizing insulating layer 12, an organic TFT 20, a lower interlayer insulating layer 13, an upper lower-to-lower insulating layer 14, a pixel electrode 15, a pixel separation insulating layer 16, an organic EL layer 17, an opposing electrode 18, and an opposing base 19.

FIG. 1 shows a region corresponding to a pixel (for example, one organic EL layer 17), and each pixel includes any number of the organic TFTs 20. FIG. 1 shows a case where each pixel includes two of the organic TFTs 20 (for use of driving and selection), but the number of the organic TFTs 20 may be one or three or more. These components, i.e., the organic TFTs 20, the pixel electrode 15, and the organic EL layer 17, are arranged in a matrix in accordance with the pixel arrangement, for example.

Note that an upward arrow shown in FIG. 1 indicates the main direction of emission for light L generated from the organic EL layer 17 for image formation use. In other words, the organic EL display device of FIG. 1 is of a top emission type that performs image display by emission of the light L upward via the opposing base 19.

The support base 11 may be made of one or two or more of a plastic material, a metal material, an inorganic material, and/or the like, for example.

The plastic material includes, for example but not limited to, polymethyl methacrylate (PMMA), polyvinyl alcohol (PVA), polyvinyl phenol (PVP), poly ether sulphone (PES), polycarbonate (PC), polyimide (PI), polyethylene terephthalate (PET), polyethylene naphthalate (PEN), polyether ether ketone (PEEK), polyacrylate (PAR), polyphenylene sulfide (PPS), and triacetylcellulose (TAC). The metal material includes, for example but not limited to, aluminum (Al), nickel (Ni), iron (Fe), chromium (Cr), stainless steel, and an alloy thereof. The inorganic material includes, for example but not limited to, silicon (Si), silicon oxide ($SiO_x$), silicon nitride ($SiN_x$), aluminum oxide ($AlO_x$), and any other metal oxides. Herein, the silicon oxide includes, for example but not limited to, glass, quartz, and spin-on glass (SOG).

This support base 11 may be a substrate with rigidity such as wafer, or a film or foil with flexibility, for example. Moreover, on the surface of the support base 11, a coating layer with a predetermined function may be provided. This coating layer includes, for example but not limited to, a buffer layer for ensuring a high degree of adhesion, and a gas barrier layer for preventing emission of gas.

Herein, the support base 11 may be in a single-layer structure or a multi-layer structure. When being in the multi-layer structure, the support base 11 includes two or more layers each made of any of the various materials described above. The single-layer structure or the multi-layer structure is not limited to the support base 11, and any other components that will be described below may have a single-layer structure or a multi-layer structure.

The planarizing insulating layer 12 includes an insulating resin material such as polyimide.

The organic TFT 20 is a thin-film transistor including an organic semiconductor layer 23. This organic TFT 20 may include a gate electrode 21, a gate insulating layer 22, the organic semiconductor layer 23, a source electrode 24, and a drain electrode 25, for example. To be specific, the organic TFT 20 herein is of a bottom gate-top contact type including the gate electrode 21 on the lower side of the organic semiconductor layer 23, and the source electrode 24 and the drain electrode 25 that are overlaid on the upper side of the organic semiconductor layer 23. Herein, the "lower side" and the "upper side" respectively denote the side close to the support base 11 and the side away therefrom. Alternatively, the organic TFT 20 may be of a top gate type including the gate electrode 21 on the upper side of the organic semiconductor layer 23, or may be of a bottom contact type including the source electrode 24 and the drain electrode 25 that are underlaid on the lower side of the organic semiconductor layer 23.

The gate electrode 21 is formed on the planarizing insulating layer 12, and may include one or two or more of a metal material, an inorganic conductive material, an organic conductive material, a carbon material, and/or the like, for example.

The metal material includes, for example but not limited to, aluminum, copper (Cu), molybdenum (Mo), titanium (Ti), chromium (Cr), nickel, palladium (Pd), gold (Au), silver (Ag), platinum (Pt), tungsten (W), tantalum (Ta), and an alloy thereof. The inorganic conductive material includes, for example but not limited to, indium oxide ($In_2O_3$), indium tin oxide (ITO), indium zinc oxide (IZO), and zinc oxide (ZnO). The organic conductive material includes, for example but not limited to, polyethylenedioxythiophene (PEDOT), polystyrenesulfonate (PSS), and polyaniline (PANI). The carbon material includes, for example but not limited to, graphite. Note here that the gate electrode 21 may be in the multi-layer structure such as PEDOT and PSS.

The gate insulating layer 22 is so formed as to at least cover the gate electrode 21, and may include one or two or more of an inorganic insulating material, an organic insulating material, and/or the like, for example. The inorganic insulating material includes, for example but not limited to, silicon oxide, silicon nitride, aluminum oxide, titanium oxide ($TiO_2$), hafnium oxide ($HfO_x$), and barium titanate ($BaTiO_3$). The organic insulating material includes, for example but not limited to, polyvinyl phenol (PVP), polyvinyl alcohol (PVA), polyimide, polyamide, polyester, polyacrylate, poly (acrylete-methacrylate), epoxy resin, benzocyclobutene (BCB), fluororesin, photosensitive polyimide, photosensitive novolac resin, and poly(para-xylylene).

The organic semiconductor layer 23 is formed on the gate insulating layer 22, and may include, for example but not limited to, one or two or more of the following organic semiconductor materials: (1) polypyrrole, (2) polythiophene, (3) isothianaphthene such as polyisothianaphthene, (4) thienylene vinylene such as polythienylene vinylene, (5) poly(p-phenylenevinylene) such as poly(p-phenylenevinylene), (6) polyaniline, (7) polyacetylene, (8) polydiacetylene, (9) polyazulene, (10) polypyrene, (11) polycarbazole, (12) polyselenophene, (13) polyfuran, (14) poly(p-phenylene), (15) polyindole, (16) polypyridazine, (17) acene such as naphthacene, pentacene, hexacene, heptacene, dibenzo pentacene, tetrabenzo pentacene, pyrene, dibenzo pyrene, chrysene, perylene, coronene, terylene, ovalene, quaterrylene, and circumanthracene, (18) acenes in which carbon atoms are partially substituted with atoms of nitrogen (N), sulfur (S), oxygen (O) or the like, or substituted derivatives of functional groups such as carbonyl groups, e.g., triphenodioxazine, triphenodithiazine, and hexacene-6,15-quinone, (19) polymeric materials such as polyvinyl carbazole, polyphenylene sulfide, and polyvinylene sulfide, and polycyclic condensed compounds, (20) oligomers with repeating units same as those in the polymeric materials described above, (21) metal phthalocyanine such as copper phthalocyanine, (22) tetrathiafulvalene, (23) tetrathiapentalene, (24) with naphthalene 1,4,5,8-tetracarboxylic diimide, N,N'-bis(4-trifluoromethyl benzyl) naphthalene 1,4,5,8-tetracarboxylic diimide, N,N'-bis(1H,1H-perfluorooctyl), N,N'-bis(1H,1H-perfluorobutyl), or N,N'-dioctyl-naphthalene 1,4,5,8-tetracarboxylic diimide derivatives, (25) naphthalene tetracarboxylic diimide such as naphthalene 2,3,6,7 tetracarboxylic diimide, (26) fused-ring tetracarboxylic diimide typified by anthracene tetracarboxylic diimides such as anthracene 2,3,6,7-tetracarboxylic diimide, (27) fullerene such as $C_{60}$, $C_{70}$, $C_{76}$, $C_{78}$, and $C_{84}$, (28) carbon nanotube such as single-walled nanotube (SWNT), (29) pigment such as merocyanine and hemicyanine pigment, and (30) peri-xanthenoxanthene compounds such as 2,9-dinaphthyl peri-xanthenoxanthene.

Other than these, the organic semiconductor materials may be derivatives of the materials described above. The derivatives are materials including one or two or more of substituents in the materials described above. The types of the substituents, the positions therefor, and others are optional.

The source electrode 24 and the drain electrode 25 are formed on the gate insulating layer 22 so as to be away from each other, and to be both partially overlap the organic semiconductor layer 23. The source electrode 24 and the drain electrode 25 may both include the material similar to that of the gate electrode 21, for example.

The lower interlayer insulating layer 13 is so formed as to at least cover the organic TFTs 20, and may include the material similar to that of the gate insulating layer 22, for example.

This organic EL display device includes a light absorption-transmission layer having predetermined light absorption-transmission characteristics. The light absorption-transmission layer is provided in a pathway that leads, to the organic semiconductor layer 23, the light L generated from the organic EL layer 17 being a light source that will be described later. Herein, the semiconductor substrate applied to the organic EL display device being an exemplary electronic device is a substrate including any component(s) (for example, the support base 11) together with the organic TFTs 20 and the light absorption-transmission layer. In such semiconductor substrate, the light absorption-transmission layer may be provided in a pathway that leads external light (including the light L generated from the light source) to the organic semiconductor layer 23. The wording "pathway that leads the light L to the organic semiconductor layer 23" is not limited to a pathway (shortest pathway) linearly connecting the organic EL layer 17 and the organic semiconductor layer 23, and may be any pathway bypassing the shortest pathway as long as it eventually leads the light L to the organic semiconductor layer 23. One reason is that the organic EL display device may include one or two or more of light-reflective components, with the reflection process for once or twice, the light L eventually reaches the organic semiconductor layer 23 after bypassing the shortest pathway.

More in detail, some of components in the organic EL display device are generally formed by a light reflective material such as a metal material, for example. Such components may include the gate electrode 21, the source electrode 24, the drain electrode 25, the pixel electrode 15, or others, for example. In this case, for example, the light L may unexpectedly reach the organic semiconductor layer 23 depending on an angle of reflection in the light-reflective components as such. Herein, there is also a possibility that the light from the outside unexpectedly passes through the support base 11 and reaches the organic semiconductor layer 23 depending on a material of the support base 11, for example.

Herein, the light absorption-transmission layer is the upper interlayer insulating layer 14, for example. This upper interlayer insulating layer 14 is formed to at least cover the lower interlayer insulating layer 13, and is positioned between the organic semiconductor layer 23 and the organic EL layer 17. As the predetermined light absorption-transmission characteristics described above, this upper interlayer insulating layer 14 has characteristics of absorbing light of a wavelength range that includes at least a part of a light absorption wavelength range of the organic semiconductor layer 23, and of passing therethrough light of the remaining wavelength range.

The wavelength range of the light to be absorbed by the upper interlayer insulating layer 14 (light of the absorption wavelength range) is not specifically limited as long as it includes at least a part of the light absorption wavelength range of the organic semiconductor layer 23. To be more specific, the wavelength range of such light may be the entire light absorption wavelength range for the organic semiconductor layer 23, may be a part thereof, or may be a combination of the entire or a part thereof together with the wavelength range not being the light absorption wavelength range.

Some of the reasons for the upper interlayer insulating layer 14 having the light absorption-transmission characteristics are as below.

First, because the upper interlayer insulating layer 14 absorbs at least a part of the light of the absorption wavelength range of the organic semiconductor layer 23, the light of the absorption wavelength range is not easily absorbed by the organic semiconductor layer 23. This accordingly suppresses the deterioration in the electrical characteristics of the organic semiconductor layer 23. In this case, especially, the light of the absorption wavelength range is not easily absorbed by the organic semiconductor layer 23 because the upper interlayer insulating layer 14 is provided between the organic EL layer 17 and the organic semiconductor layer 23.

Secondly, the upper interlayer insulating layer 14 may not have to be baked at a high temperature unlike in the case of using a general resist material in the color of black for achieving the light absorption-transmission characteristics. Accordingly, deterioration of the electrical characteristics of the organic semiconductor layer 23 resulting from the high-temperature baking or the like is suppressed or prevented.

Thirdly, when the upper interlayer insulating layer 14 is so formed as to absorb light of the absorption wavelength range but to pass therethrough light of a wavelength range for optical processing, the light having been passed therethrough may be used for any desired optical processing irrespective of the use of the light-absorbing upper interlayer insulating layer 14. The wording "optical processing" may refer to any process that uses light for achieving any desired object in the manufacturing process of the organic EL display device, and may include, for example but not limited to, optical patterning by photolithography, photo-curing reaction, breaching (make transparent photoreacting portions), or others. Herein, the optical processing may be any process that processes: the upper interlayer insulating layer 14 itself; any other components using the light having been passed through the upper interlayer insulating layer 14; or both of these. As an example, when the upper interlayer insulating layer 14 is so configured that the light transmission wavelength range thereof includes a wavelength range for optical patterning of the upper interlayer insulating layer 14, the upper interlayer insulating layer 14 may be in any desired shape (tapered shape) by being subjected to patterning with a high precision. As a result, in the manufacturing process of the organic EL display device, the upper interlayer insulating layer 14 is formed easily, and is formed with a higher precision.

The wavelength range of light to be absorbed by the upper interlayer insulating layer 14, and the wavelength range of light to be passed therethrough are both arbitrarily determined in accordance with a condition such as the type of the optical processing described above.

The material for forming the upper interlayer insulating layer 14 is not specifically limited, and may be an inorganic material, an organic material, or both as long as the material is insulative and has the light absorption-transmission characteristics. When an organic material is used, the material may include the skeleton same as the main skeleton of the material of the organic semiconductor layer 23 (organic semiconductor skeleton), or may include any other skeleton not the organic semiconductor skeleton. The former organic material may include a portion offering the characteristics as an organic semiconductor (organic semiconductor skeleton), and a portion offering the characteristics as an insulator, for example. The portion offering the characteristics as an insulator may be a material for forming a general interlayer insulating layer, and may be a polymeric material including, for example but not limited to, polyvinyl phenol, polyimide resin, novolac resin, cinnamate resin, acrylic resin, epoxy resin, styrene resin, poly-para-xylene, and poly-uric acid. The organic semiconductor skeleton may be included in the primary chain of the polymeric material, in the side chain thereof, or in the both. Other than that, the material of the upper interlayer insulating layer 14 may be a mixture of an organic material (material including the organic semiconductor skeleton), and an insulative polymeric material.

In particular, when the organic semiconductor layer 23 is made of an organic semiconductor material including the predetermined organic semiconductor skeleton, the upper interlayer insulating layer 14 preferably includes a material including the skeleton same as the organic semiconductor material (organic insulating material). One reason is that the absorption wavelength range for the organic semiconductor layer 23 is determined mainly based on the type of the organic semiconductor skeleton, and when the upper interlayer insulating layer 14 includes the skeleton same as the organic semiconductor skeleton of the organic semiconductor layer 23, easier absorption of the light of the absorption wavelength range by the upper interlayer insulating layer 14 is ensured.

Described below are specific examples of the material forming the upper interlayer insulating layer 14, i.e., the material including the skeleton same as the organic semiconductor skeleton of the organic semiconductor layer 23.

When the material of the organic semiconductor layer 23 is a peri-xanthenoxanthene derivative expressed by Chemical Formula 1 below, the material of the upper interlayer insulating layer 14 is a polyvinyl phenol derivative expressed by Chemical Formula 2 below. This polyvinyl phenol derivative is a compound in which the polyvinyl phenol is partially substituted with the peri-xanthenoxanthene derivative. In this polyvinyl phenol derivative, mainly, the part of the peri-xanthenoxanthene derivative absorbs the light of the absorption wavelength range, and the part of the polyvinyl phenol offers the insulation characteristics. Note that, in Chemical Formulas 1 and 2, "R" denotes a hydrocarbon group (the carbon number is not specifically limited), and the hydrocarbon group may include, for example but not limited to, a methyl and ethyl group. Herein, the two "R"s may be of the same type, or of the different types. The values of "m" and "n" representing the number of repeating units each take any number as long as the number is an integer of one or larger. Herein, the values of "m" and "n" may take the same value or different values.

[Chemical Formulae 1 and 2]

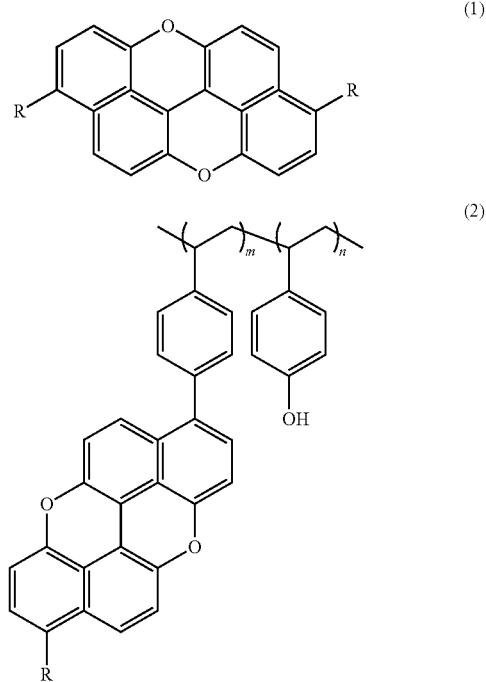

Moreover, when the material of the organic semiconductor layer 23 is pentacene expressed by Chemical Formula 3 below, the material of the upper interlayer insulating layer 14 is a poly(vinyl-cinnamate) derivative expressed by Chemical Formula 4 below. This Poly(vinyl-cinnamate) derivative is a compound in which a part of the poly(vinyl-cinnamate) is substituted with pentacene. In this poly(vinyl-cinnamate) derivative, mainly, the part of the pentacene absorbs the light of the absorption wavelength range, and the part of the poly (vinyl-cinnamate) offers the insulation characteristics. Note that the values of "m" and "n" in Chemical Formula 4 are similar to those described above by referring to Chemical Formula 2.

[Chemical Formulae 3 and 4]

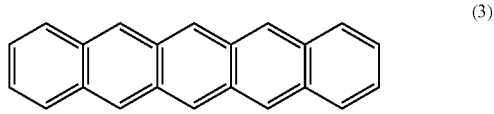

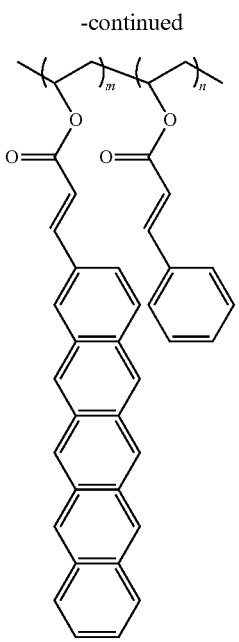

(4)

Alternatively, the material of the upper interlayer insulating layer 14 may be a mixture of the material (insulating material) similar to that of the gate insulating layer 22 described above, and the material (organic semiconductor material) similar to that of the organic semiconductor layer 23. In this case, by appropriately adjusting the content of the organic semiconductor material, in the upper interlayer insulating layer 14, the organic semiconductor material absorbs the light of the absorption wavelength range, and the insulating material offers the insulation characteristics.

Figure 2:
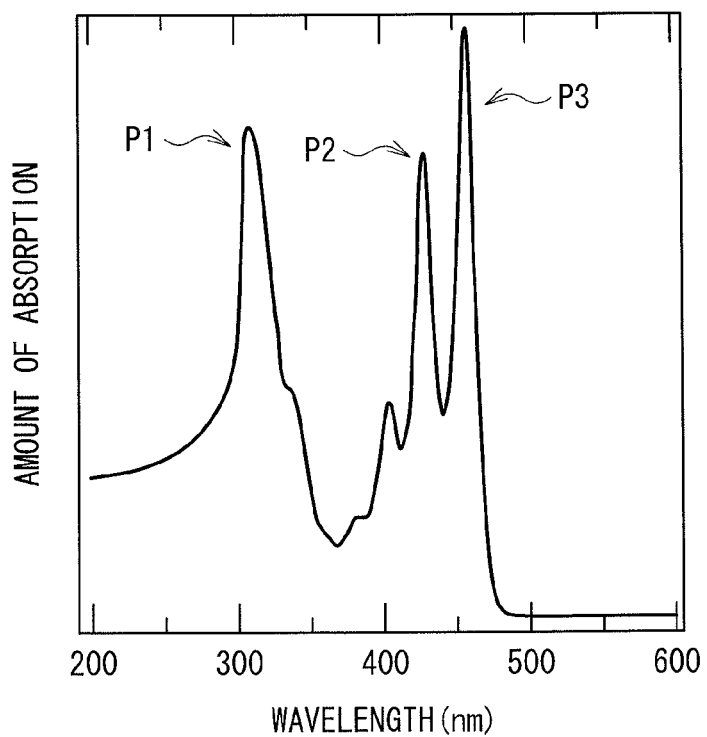
FIG. 2 is a diagram showing an exemplary absorption spectrum of a material forming an organic semiconductor layer.

FIG. 2 shows an exemplary absorption spectrum of the organic semiconductor layer 23. The material of this organic semiconductor layer 23 is a peri-xanthenoxanthene derivative of Chemical Formula 1, and to be more specific, is a compound expressed by Chemical Formula 5 below.

[Chemical Formula 5]

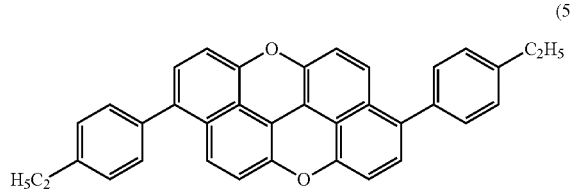

(5)

As shown in FIG. 2, the compound expressed by Chemical Formula 5 shows, mainly, three absorption peaks P1 to P3. The absorption peak P1 has the peak wavelength of about 410 nm, the absorption peak P2 has the peak wavelength of about 430 nm, and the absorption peak P3 has the peak wavelength of about 460 nm. Therefore, when the polyvinyl phenol derivative of Chemical Formula 2 includes the compound of Chemical Formula 5 as the organic semiconductor skeleton, the polyvinyl phenol derivative includes the absorption wavelength range corresponding to the three peak wavelengths described above.

However, as described above, it is good enough for the upper interlayer insulating layer 14 to absorb the light of the wavelength range that includes at least a part of the light absorption wavelength range of the organic semiconductor layer 23. One reason is that even when the upper interlayer insulating layer 14 absorbs only the light of the wavelength range being a part of the light absorption wavelength range of the organic semiconductor layer 23, the deterioration in the electrical characteristics of the organic semiconductor layer 23 is still suppressed. Accordingly, when the absorption spectrum of the organic semiconductor layer 23 shows one or two or more absorption peaks, it is good enough for the light absorption wavelength range of the upper interlayer insulating layer 23 to include a wavelength range corresponding to at least one of the absorption peaks. To be more specific, as exemplarily shown in FIG. 2, when the absorption spectrum of the organic semiconductor layer 23 shows the three absorption peaks P1 to P3, the upper interlayer insulating layer 14 may absorb light of a wavelength range corresponding to one or more of the absorption peaks P1 to P3.

In the organic El display device, the pathway that leads the light L, generated from the organic EL layer 17, to the organic semiconductor layer 23 is preferably provided with a light-shielding layer for shielding of the light L. One reason is that the light L, which reaches the organic semiconductor layer 23 via a location at which the light-shielding layer is provided, is prevented from reaching the organic semiconductor layer 23 by virtue of the light-shielding layer provided as such. This light-shielding layer may be light reflective or absorptive. When the light-shielding layer is light reflective, the light L having reached the light-shielding layer is reflected and then guided to the light absorption-transmission layer (the upper interlayer insulating layer 14 in this example). Herein, the light-shielding layer is a non-transmissive electrode, and more specifically, may be one or more of the gate electrode 21, the source electrode 24, the drain electrode 25, and the pixel electrode 15, for example.

The pixel electrode 15 is separately provided for each pixel on the upper interlayer insulating layer 14, and may include a reflective material such as aluminum, silver, titanium, and chromium. Such pixel electrode 15 may be connected to the drain electrode 25 of the organic TFT 20 via openings (contact holes) 13K and 14K, which are respectively formed in the lower interlayer insulating layer 13 and the upper interlayer insulating layer 14, for example.

The pixel separation insulating layer 16 is formed at least on the upper interlayer insulating layer 14, and includes an opening 16K for each pixel. This pixel separation insulating layer 16 may include the material similar to that of the planarizing insulating layer 12, for example. Preferably, the pixel separation insulating layer 16 includes a photosensitive resin material that is to be shaped by photopatterning, reflowing, or others, in order to simplify the manufacturing process and to form the pixel separation insulating layer 16 to have any desired shape, for example.

The organic EL layer 17 is formed in the opening 16K provided in the pixel separation insulating layer 16, and is connected to the pixel electrode 15. This organic EL layer 17 is a light source that generates the light L for image formation use, and may include a light-emitting layer capable of generating light of any color utilizing the organic EL phenomenon, for example. The material of this light-emitting layer is selected optionally in accordance with the color of light to be generated. Herein, the organic EL layer 17 may be in the multi-layer structure including an electron transport layer, a hole transport layer, or others together with the light-emitting layer, for example.

The opposing electrode 18 is formed on the pixel separation insulating layer 16 and the organic EL layer 17, and is connected to the organic EL layer 17. This opposing electrode 18 may include a transmissive conductive material such as ITO and IZO for passing therethrough the light L generated from the organic EL layer 17, for example. Alternatively, the opposing electrode 18 may include a transmissive metal material such as calcium (Ca) and an alloy thereof, a transmissive organic conductive material such as PEDOT, or others. The pixel electrode 15 and the organic EL layer 17 are each separately provided on a pixel basis as described above, whereas the opposing electrode 18 may be so formed in a piece as to connect the pixels together, for example.

The opposing base 19 may be made of a transmissive material such as glass and a plastic material for passing therethrough the light L for image formation use, for example.

Note that the organic EL display device may include components other than those described above.

[Operation of Organic EL Display Device]

In this organic EL display device, when a pixel is selected by the organic TFT 20 for selection use, for example, the selected pixel is driven by the organic TFT 20 for driving use. This allows the light L to be generated from the organic EL layer 17 for image formation use when an electric field is applied across the pixel electrode 15 and the opposing electrode 18. This light L is emitted to the outside via the opposing base 19 so that image display is performed.

[Function and Effect of Organic EL Display Device]

According to the organic EL display device, the light absorption-transmission layer having the light absorption-transmission characteristics described above (the upper interlayer insulating layer 14) is provided in the pathway that leads the light L, generated from the organic EL layer 17 that serves as a light source, to the organic semiconductor layer 23. This accordingly suppresses the deterioration in the electrical characteristics of the organic semiconductor layer 23 resulting from the absorption of light of the absorption wavelength range and from the baking of the upper interlayer insulating layer 14 at a high temperature as described above. This ensures the electrical characteristics of the organic semiconductor layer 23.

In particular, when the upper interlayer insulating layer 14 is configured to have the light transmission wavelength range that includes a wavelength range of light used for the optical processing such as optical patterning, it is possible to perform the optical processing that uses the light having been passed therethrough. Moreover, when the upper interlayer insulating layer 14 is provided between the organic EL layer 17 and the organic semiconductor layer 23, further suppression of the absorption of the light of the absorption wavelength range by the organic semiconductor layer 23 is achieved.

Further, when the upper interlayer insulating layer 14 includes the organic semiconductor skeleton same as that of the organic semiconductor layer 23, easier absorption, by the upper interlayer insulating layer 14, of the light of the absorption wavelength range for the organic semiconductor layer 23 is ensured. This further suppresses the deterioration in the electrical characteristics of the organic semiconductor layer 23. Moreover, when the light-shielding layer (the pixel electrode 15, for example) is provided in the pathway that leads to the organic semiconductor layer 23 the light L generated from the organic EL layer 17, the effect to be achieved is enhanced.

[Modification Examples]

In the above embodiment, the upper interlayer insulating layer 14 is provided with the light absorption-transmission characteristics. Alternatively, any other insulating layer provided in the pathway for the light L, generated from the organic semiconductor layer 17, to reach the organic semiconductor layer 23 may have the light absorption-transmission characteristics. The wording "any other insulating layer" may refer to the lower interlayer insulating layer 13, the pixel separation insulating layer 16, the gate insulating layer 22, and/or the planarizing insulating layer 12, as shown in FIG. 1, for example. In this case, one or more of the layers, i.e., the upper interlayer insulating layer 14, the lower interlayer insulating layer 13, the pixel separation insulating layer 16, the gate insulating layer 22, the planarizing insulating layer 12, and others may have the light absorption-transmission characteristics.

Also in the above embodiment, the insulating layer such as the upper interlayer insulating layer 14 has the light absorption-transmission characteristics. Alternatively, a conductive layer may have the absorption-transmission characteristics. This conductive layer may be one or more of the gate electrode 21, the source electrode 24, the drain electrode 25, the pixel electrode 15, and others, for example. The conductive layer having the light absorption-transmission characteristics as such includes an organic semiconductor material, an organic conductive material, or the like, for example. To be specific, the conductive layer includes, for example but not limited to, PEDOT-PSS, polyaniline, carbon nanotube, and graphene. These materials generally have a wide absorption wavelength range, and through adjustment of a thickness of the conductive layer, each of the materials solely offers the light absorption-transmission characteristics.

Moreover, the organic EL display device is not limited to be of a top emission type with which the light L for image formation use is emitted upward via the opposing base 19, and may be of a bottom emission type with which the light L is emitted downward via the support base 11.

Figure 3:
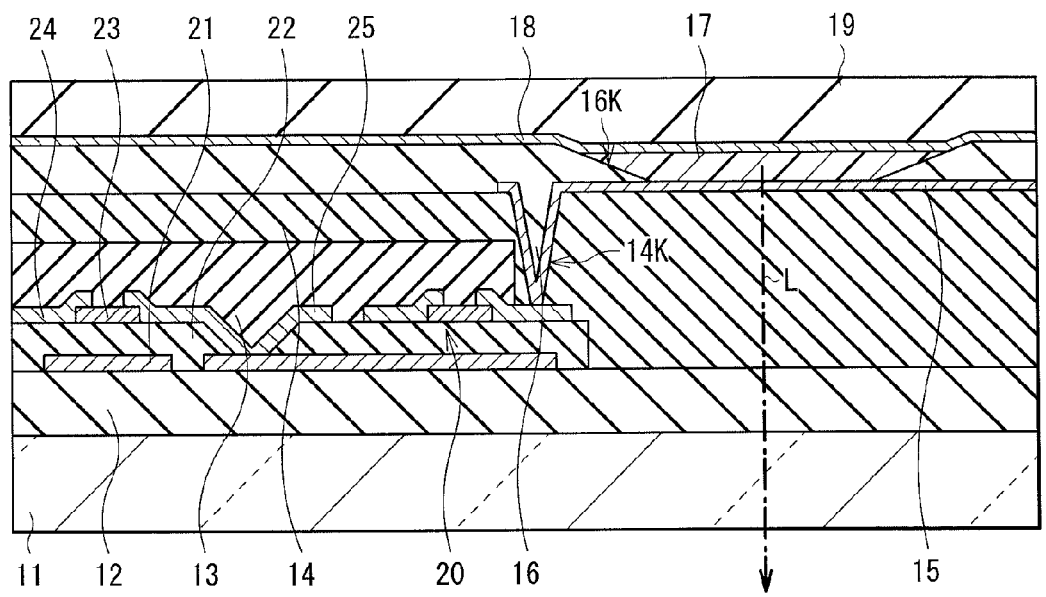
FIG. 3 is a cross-sectional diagram showing the configuration of an electronic device (organic EL display device) in a modification example.

FIG. 3 shows a modification example related to the configuration of an organic EL display device, and shows the cross-sectional configuration corresponding to FIG. 1. Note that, in FIG. 3, the components shown in FIG. 1 are denoted with the same reference numerals. The organic EL display device of FIG. 3 is similar in configuration to the organic EL display device of FIG. 1 except the following respects.

The support base 11 is made of the transmissive material similar to that of the opposing base 19 in the display device of a top emission type for passing therethrough the light L. The position of the organic EL layer 17 formed in the opening 16K of the pixel separation insulating layer 16 is shifted in the lateral direction not to overlap the organic TFT 20, and the region for forming the pixel electrode 15 is also made larger accordingly. The opposing base 19 is made of the material similar to that of the support base 11 in the display device of a top emission type. Herein, the space between the planarizing insulating layer 12 and the pixel electrode 15 is filled with the upper interlayer insulating layer 14, for example.

Also in this case, the effect similar to that with the display device of the top emission type is achieved because the upper interlayer insulating layer 14 provided between the organic semiconductor layer 23 and the organic EL layer 17 has the light absorption-transmission characteristics. The remaining effect is similar to that with the display device of the top emission type.

Note that the modification examples described above with an example of the top emission type are applicable also to the bottom emission type shown in FIG. 3. To be specific, the lower interlayer insulating layer 13 or others may have the light absorption-transmission characteristics, or other components, i.e., the pixel separation insulating layer 16, the gate insulating layer 22, the planarizing insulating layer 12, or others, may have the light absorption-transmission characteristics. Still alternatively, the conductive layer such as the pixel electrode 15 may have the light absorption-transmission characteristics.

2. Electronic Device in Second Embodiment

Liquid Crystal Display Device

[Configuration of Liquid Crystal Display Device]

An electronic device according to a second embodiment of the present technology is a liquid crystal display device being another exemplary display device, for example, and similarly to the organic EL display device, uses an organic TFT as a switching element. Note that, in the description below, the components in the first embodiments are referred to if appropriate, and similarly to the first embodiment, the semiconductor substrate according to this embodiment of the present technology is described below together with the electronic device.

Figure 4:
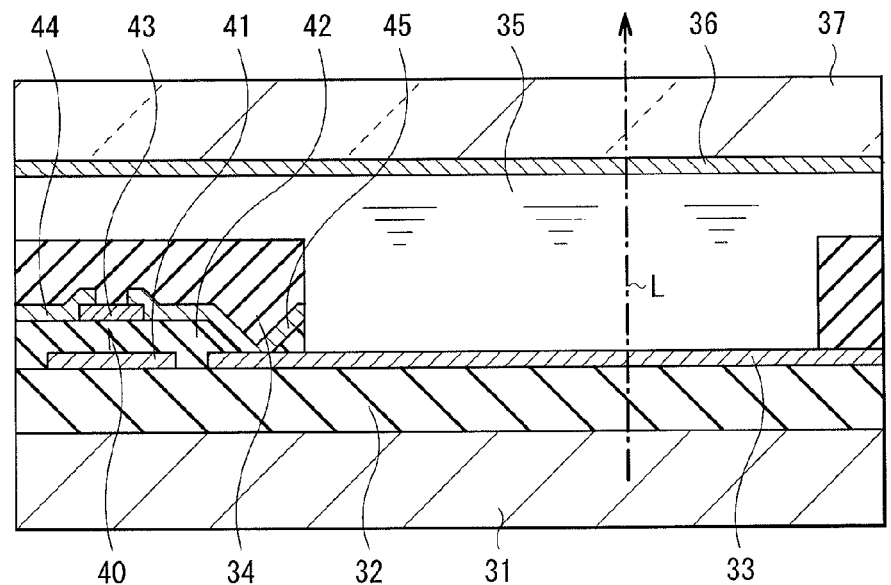
FIG. 4 is a cross-sectional diagram showing the configuration of an electronic device (liquid crystal display device) according to a second embodiment of the present technology.

FIG. 4 shows the cross-sectional configuration of a liquid crystal display device. This liquid crystal display device includes, on a backlight 31 being a support base, a planarizing insulating layer 32, an organic TFT 40, a pixel electrode 33, an interlayer insulating layer 34, a liquid crystal layer 35, an opposing electrode 36, and an opposing base 37, for example.

FIG. 4 shows a region corresponding to a pixel, and each pixel includes any number of the organic TFTs 40. FIG. 4 shows a case where each pixel includes one organic TFT 40, but the number of the organic TFTs 40 may be two or more. The organic TFTs 40 and the pixel electrode 33 are arranged in a matrix in accordance with the pixel arrangement, for example.

Note that an upward arrow shown in FIG. 4 indicates the main direction of emission for the light L generated from the backlight 31 for image formation use. In other words, the liquid crystal display device of FIG. 4 is of a self-emitting type (backlight type) including the backlight 31 being a light source.

The backlight 31 includes, for example but not limited to, a light emitting diode (LED). Note here that the backlight 31 may also be any other types of light sources.

Also in this liquid crystal display device, the light absorption-transmission layer having the light absorption-transmission characteristics is provided in the pathway that leads the light L generated from the backlight 31, being a light source, to the organic semiconductor layer 43.

The planarizing insulating layer 32 is formed on the backlight 31, and is provided between the backlight 31 and the organic semiconductor layer 43. This planarizing insulating layer 32 has the light absorption-transmission characteristics, for example, and includes the material similar to that of the upper interlayer insulating layer 14 also having the light absorption-transmission characteristics. One reason is that, as described in the first embodiment, this suppresses the deterioration in the electrical characteristics of the organic semiconductor layer 43 resulting from the absorption of light of the absorption wavelength range and the baking at a high temperature as described above, and this may also allow the optical processing that utilizes the light, having been passed through the planarizing insulating layer 32, to be performed.

The organic TFT 40 is formed on the planarizing insulating layer 32, and is in the configuration similar to that of the organic TFT 20 except for including a gate electrode 41, a gate insulating layer 42, an organic semiconductor layer 43, a source electrode 44, and a drain electrode 45. The pixel electrode 33 is formed on the planarizing insulating layer 32, and may include the material similar to that of the pixel electrode 15, for example. This pixel electrode 33 may be provided separately for each pixel, and is connected to the drain electrode 45 of the organic TFT 40, for example.

The interlayer insulating layer 34 is so formed as to at least cover the organic TFT 40. This interlayer insulating layer 34 preferably includes a material having the light absorption-transmission characteristics similarly to the planarizing insulating layer 32, for example. One reason is that this further suppresses the deterioration in the electrical characteristics of the organic semiconductor layer 43.

The liquid crystal layer 35 is provided between the pixel electrode 33 and the opposing electrode 36, and includes a plurality of liquid crystal molecules that change in orientation (tilt of the major axis with respect to the heading direction of the light L) in accordance with an electric field. The type of these liquid crystal molecules is optional. In this example, in a pixel, a main portion of the liquid crystal layer 41 substantially involved in image display is so arranged as to be next to the organic TFT 40.

The opposing electrode 36 is so formed as to sandwich the liquid crystal layer 35 with the pixel electrode 33, and may include the material similar to that of the opposing electrode 18, for example. This opposing electrode 36 may be so formed in a piece as to connect the pixels together, for example.

The opposing base 37 may be formed by the material similar to that of the opposing base 19 in the display device of the top emission type, for example, for passing the light L therethrough for image formation.

Note that the liquid crystal display device may be provided with components other than those described above. Such other components include, for example but not limited to, a retardation film, a polarizing plate, an orientation film, and a backlight unit.

[Operation of Liquid Crystal Display Device]

With this liquid crystal display device, a pixel is selected by the organic TFT 40, and in response to application of an electric field between the pixel electrode 33 and the opposing electrode 36 in the selected pixel, the liquid crystal molecules in the liquid crystal layer 35 change in orientation in accordance with the intensity of the electric field. Accordingly, in accordance with the orientation of the liquid crystal molecules, the light L is controlled in amount of transmission (transmittance) so that image display is performed.

[Function and Effect of Liquid Crystal Display Device]

According to the liquid crystal display device, the light absorption-transmission layer having the light absorption-transmission characteristics (the planarizing insulating layer 32) is provided in the pathway that leads the light L generated from the backlight 31, being a light source, to the organic semiconductor layer 43. This accordingly leads to the function same as that of the first embodiment so that the electrical characteristics of the organic semiconductor layer 43 are ensured.

In particular, when the interlayer insulating layer 34 also has the light absorption-transmission characteristics, the deterioration in the electrical characteristics of the organic semiconductor layer 43 is further suppressed. Accordingly, the effect to be produced is more enhanced.

The function and effect of the liquid crystal display device other than those described above are similar to those of the organic EL display device.

[Modification Examples]

In the second embodiment, the planarizing insulating layer 32 and the interlayer insulating layer 34 are provided with the light absorption-transmission characteristics. Alternatively, any other insulating layer provided in the pathway that leads the light L generated from the backlight 31 to the organic semiconductor layer 43 may have the light absorption-transmission characteristics. The wording "other insulating layer"

may refer to the gate insulating layer 42 or others as shown in FIG. 4, for example. In this case, one or more of these layers, i.e., the planarizing insulating layer 32, the interlayer insulating layer 34, the gate insulating layer 42, and others, may have the light absorption-transmission characteristics.

Also in the second embodiment, the insulating layer such as the planarizing insulating layer 32 has the light absorption-transmission characteristics. Alternatively, a conductive layer may have the absorption-transmission characteristics. This conductive layer may be one or more of the gate electrode 41, the source electrode 44, the drain electrode 45, and others, and may be made of the material similar to that described in the first embodiment, for example.

While the present technology has been described in detail by referring to some embodiments and modifications, the present technology is not limited to the embodiments and the modifications described above, and numerous other modifications may be made.

For example, the insulating layer having the light absorption-transmission characteristics is not limited to those described above (for example, such as the upper interlayer insulating layer 14 of the organic EL display device, or such as the interlayer insulating layer 34 of the liquid crystal display device). The insulating layer having the light absorption-transmission characteristics is not limited to those described above as long as it is disposed in the pathway that leads the light generated from the light source to the organic semiconductor layer. As such, it is good enough for any component provided in the pathway for the light to have the light absorption-transmission characteristics, and the same is true for a case where the conductive layer has the light absorption-transmission characteristics.

Further, the electronic device and the semiconductor substrate according to the embodiments and the modifications of the present technology are not limited to an organic EL display device and a liquid crystal display device, but may be other types of display devices, for example. Such other types of display devices include, for example but not limited to, an MEMS (Micro Electro Mechanical Systems) display section (MEMS type display device). Also in this case, the effect similar to that in the embodiments and the modifications is achieved.

Still further, the electronic device and the semiconductor substrate according to the embodiments and the modifications of the present technology may be applied to devices other than display devices. Such devices include, for example but not limited to, a sensor matrix, a memory sensor, an RF ID tag (Radio Frequency Identification), and a sensor array. Also in this case, the effect similar to that in the embodiments and the modifications is achieved.

Accordingly, it is possible to achieve at least the following configurations from the above-described example embodiments and the modifications of the disclosure.

(1) An electronic device, including:
a light source;
a thin-film transistor including an organic semiconductor layer; and
a light absorption-transmission layer provided in a pathway that leads light generated from the light source to the organic semiconductor layer, the light absorption-transmission layer absorbing light of a wavelength range that includes at least a part of a light absorption wavelength range of the organic semiconductor layer, and allowing light of a remaining wavelength range to pass therethrough.

(2) The electronic device according to (1), wherein a light absorption wavelength range of the light absorption-transmission layer includes a wavelength range that corresponds to at least one of a single or a plurality of absorption peaks appearing in an absorption spectrum of the organic semiconductor layer.

(3) The electronic device according to (1) or (2), wherein a light transmission wavelength range of the light absorption-transmission layer includes a wavelength range of light provided for optical processing.

(4) The electronic device according to (3), wherein the light transmission wavelength range of the light absorption-transmission layer includes a wavelength range of light provided for optical patterning of the light absorption-transmission layer.

(5) The electronic device according to any one of (1) to (4), wherein the light absorption-transmission layer is an insulating layer.

(6) The electronic device according to any one of (1) to (5), wherein the light absorption-transmission layer is provided between the light source and the organic semiconductor layer.

(7) The electronic device according to any one of (1) to (6), further including a light-shielding layer provided in the pathway that leads the light generated from the light source to the organic semiconductor layer, the light-shielding layer shielding the light generated from the light source.

(8) The electronic device according to (7), wherein the light-shielding layer is a non-transmissive electrode.

(9) An electronic device, including:
a light source;
a thin-film transistor including an organic semiconductor layer; and
a light absorption-transmission layer provided in a pathway that leads light generated from the light source to the organic semiconductor layer, the light absorption-transmission layer including an organic semiconductor skeleton substantially same as an organic semiconductor skeleton of the organic semiconductor layer.

(10) The electronic device according to any one of (1) to (9), wherein the light absorption-transmission layer is one or more, in an organic electroluminescence display device, of an interlayer insulating layer, a pixel separation insulating layer, a gate insulating layer, and a planarizing insulating layer.

(11) The electronic device according to any one of (1) to (9), wherein the light absorption-transmission layer is one or more, in a liquid crystal display device, of an interlayer insulating layer, a gate insulating layer, and a planarizing insulating layer.

(12) A semiconductor substrate, including:
a thin-film transistor including an organic semiconductor layer; and
a light absorption-transmission layer provided in a pathway that leads external light to the organic semiconductor layer, the light absorption-transmission layer absorbing light of a wavelength range that includes at least a part of a light absorption wavelength range of the organic semiconductor layer, and allowing light of a remaining wavelength range to pass therethrough.

(13) A semiconductor substrate, including:
a thin-film transistor including an organic semiconductor layer; and
a light absorption-transmission layer provided in a pathway that leads external light to the organic semiconductor layer, the light absorption-transmission layer including an organic semiconductor skeleton substantially same as an organic semiconductor skeleton of the organic semiconductor layer.

The present disclosure contains subject matter related to that disclosed in Japanese Priority Patent Application JP 2011-183985 filed in the Japan Patent Office on Aug. 25, 2011, the entire content of which is hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. An electronic device, comprising:
a light source;
a thin-film transistor including an organic semiconductor layer; and
a light absorption-transmission layer provided in a pathway that leads light generated from the light source to the organic semiconductor layer, the light absorption-transmission layer absorbing light of a wavelength range that includes at least a part of a light absorption wavelength range of the organic semiconductor layer, and allowing light of a remaining wavelength range to pass therethrough.

2. The electronic device according to claim 1, wherein a light absorption wavelength range of the light absorption-transmission layer includes a wavelength range that corresponds to at least one of a single or a plurality of absorption peaks appearing in an absorption spectrum of the organic semiconductor layer.

3. The electronic device according to claim 1, wherein a light transmission wavelength range of the light absorption-transmission layer includes a wavelength range of light provided for optical processing.

4. The electronic device according to claim 3, wherein the light transmission wavelength range of the light absorption-transmission layer includes a wavelength range of light provided for optical patterning of the light absorption-transmission layer.

5. The electronic device according to claim 1, wherein the light absorption-transmission layer is an insulating layer.

6. The electronic device according to claim 1, wherein the light absorption-transmission layer is provided between the light source and the organic semiconductor layer.

7. The electronic device according to claim 1, further comprising a light-shielding layer provided in the pathway that leads the light generated from the light source to the organic semiconductor layer, the light-shielding layer shielding the light generated from the light source.

8. The electronic device according to claim 7, wherein the light-shielding layer is a non-transmissive electrode.

9. The electronic device according to claim 1, wherein the light absorption-transmission layer is one or more, in an organic electroluminescence display device, of an interlayer insulating layer, a pixel separation insulating layer, a gate insulating layer, and a planarizing insulating layer.

10. The electronic device according to claim 1, wherein the light absorption-transmission layer is one or more, in a liquid crystal display device, of an interlayer insulating layer, a gate insulating layer, and a planarizing insulating layer.

11. An electronic device, comprising:
a light source;
a thin-film transistor including an organic semiconductor layer; and
a light absorption-transmission layer provided in a pathway that leads light generated from the light source to the organic semiconductor layer, the light absorption-transmission layer including an organic semiconductor skeleton substantially same as an organic semiconductor skeleton of the organic semiconductor layer.

12. A semiconductor substrate, comprising:
a thin-film transistor including an organic semiconductor layer; and
a light absorption-transmission layer provided in a pathway that leads external light to the organic semiconductor layer, the light absorption-transmission layer absorbing light of a wavelength range that includes at least a part of a light absorption wavelength range of the organic semiconductor layer, and allowing light of a remaining wavelength range to pass therethrough.

* * * * *